US011041260B2

(12) United States Patent
Ando et al.

(10) Patent No.: US 11,041,260 B2
(45) Date of Patent: Jun. 22, 2021

(54) CHARGE-GENERATING THREAD FOR BACTERIUM-COUNTERMEASURE, CLOTH FOR BACTERIUM-COUNTERMEASURE, CLOTH, CLOTHING ARTICLE, MEDICAL MEMBER, CHARGE-GENERATING THREAD THAT ACTS ON LIVING BODY, AND CHARGE-GENERATING THREAD FOR SUBSTANCE-ADSORPTION

(71) Applicant: Murata Manufacturing Co., Ltd., Nagaokakyo (JP)

(72) Inventors: Masamichi Ando, Nagaokakyo (JP); Satoshi Ishino, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 147 days.

(21) Appl. No.: 16/183,884

(22) Filed: Nov. 8, 2018

(65) Prior Publication Data
US 2019/0078239 A1   Mar. 14, 2019

Related U.S. Application Data

(63) Continuation of application No. PCT/JP2017/017237, filed on May 2, 2017.

(30) Foreign Application Priority Data

Jun. 6, 2016 (WO) .................. PCT/JP2016/066749
Nov. 1, 2016 (WO) .................. PCT/JP2016/082416

(51) Int. Cl.
*D02G 3/44* (2006.01)
*D02G 3/02* (2006.01)
(Continued)

(52) U.S. Cl.
CPC ............. *D02G 3/441* (2013.01); *A01N 37/36* (2013.01); *D02G 3/02* (2013.01); *D02G 3/449* (2013.01); *D03D 15/00* (2013.01)

(58) Field of Classification Search
CPC ....................................................... D02G 3/44
See application file for complete search history.

(56) References Cited

U.S. PATENT DOCUMENTS

| | | |
|---|---|---|
| 3,798,474 A | 3/1974 | Cassand |
| 5,031,162 A | 7/1991 | Morimoto et al. |

(Continued)

FOREIGN PATENT DOCUMENTS

| | | |
|---|---|---|
| DE | 202005021245 U1 | 6/2007 |
| EP | 3467169 A1 | 4/2019 |

(Continued)

OTHER PUBLICATIONS

International Search Report issued for PCT/JP2017/017237, dated Jul. 25, 2017.

(Continued)

*Primary Examiner* — Andrew T Piziali
(74) *Attorney, Agent, or Firm* — Arent Fox LLP

(57) ABSTRACT

A charge-generating thread for bacterium-countermeasure that includes a charge-generating fiber. The charge-generating fiber generates a charge by energy imparted from the outside of the fiber so as to restrain the proliferation of bacteria by the generated charge.

39 Claims, 11 Drawing Sheets

(51) Int. Cl.
*D03D 15/00* (2021.01)
*A01N 37/36* (2006.01)

(56) References Cited

U.S. PATENT DOCUMENTS

| | | |
|---|---|---|
| 6,494,921 B1 | 12/2002 | Bennett |
| 9,090,995 B2 | 7/2015 | Imashiro et al. |
| 2006/0150818 A1 | 7/2006 | Okamoto et al. |
| 2008/0307899 A1 | 12/2008 | Von Lilienfeld-Toal et al. |
| 2010/0120315 A1 | 5/2010 | Imashiro et al. |
| 2013/0082424 A1 | 4/2013 | Imashiro et al. |
| 2014/0134418 A1 | 5/2014 | Lee et al. |
| 2015/0280102 A1* | 10/2015 | Tajitsu ............... H01L 41/082 310/338 |
| 2016/0190427 A1 | 6/2016 | Kim et al. |
| 2017/0029985 A1 | 2/2017 | Tajitsu et al. |
| 2018/0108826 A1 | 4/2018 | Tajitsu |
| 2018/0151795 A1* | 5/2018 | Cobanoglu ........... H01L 41/087 |
| 2018/0358541 A1 | 12/2018 | Tajitsu et al. |

FOREIGN PATENT DOCUMENTS

| | | |
|---|---|---|
| GB | 2 516 987 A | 2/2015 |
| JP | S51132986 A | 11/1976 |
| JP | S60151386 A | 8/1985 |
| JP | H07310284 A | 11/1995 |
| JP | H08226078 A | 9/1996 |
| JP | H09194304 A | 7/1997 |
| JP | 3025272 B2 | 3/2000 |
| JP | 2000144545 A | 5/2000 |
| JP | 2000239969 A | 9/2000 |
| JP | 3165992 B2 | 5/2001 |
| JP | 2001254270 A | 9/2001 |
| JP | 3281640 B2 | 5/2002 |
| JP | 2002242061 A | 8/2002 |
| JP | 2003027371 A | 1/2003 |
| JP | 2004300650 A | 10/2004 |
| JP | 2009516839 A | 4/2009 |
| JP | 2011086114 A | 4/2011 |
| JP | 2011200295 A | 10/2011 |
| JP | 2013124424 A | 6/2013 |
| JP | 2014033478 A | 2/2014 |
| JP | 201504429 A | 11/2015 |
| JP | 2016127202 A | 7/2016 |
| JP | 2016213267 A | 12/2016 |
| JP | 2017183432 A | 10/2017 |
| WO | 2008123345 A1 | 10/2008 |
| WO | 2014161920 A1 | 10/2014 |
| WO | 2015159832 A1 | 10/2015 |
| WO | 2017115860 A1 | 7/2017 |

OTHER PUBLICATIONS

Written Opinion of the International Searching Authority issued for PCT/JP2017/017237, dated Jul. 25, 2017.
Takaki, Koichi; "Agricultural and Food Processing Applications of High-Voltage and Plasma Technologies"; J. HTSJ, vol. 51, No. 216, Jul. 2012, pp. 64-69. (Translation of Section 5 p. 67 "Freshness retention and component extraction by high voltage").
Microorganism Control—Science and Engineering published by Kodansha Ltd, Copyright T. Tsuchido, H. Kourai, H. Matsuoka, J. Koizumi, 2002; "Electrical Control" Section 41.3, p. 50 (Translation of section 41.3, p. 50).
Fukada, E.; "Piezoelectricity of Biopolymers", Polymer vol. 16 (1967), No. 9, pp. 795-800. (Translation of abstract only).
Definition of "nonwoven fabric" Complete Textile Glossary, Celanese Acetate, copyright 2001. (Year 2001).

* cited by examiner

US 11,041,260 B2

CHARGE-GENERATING THREAD FOR BACTERIUM-COUNTERMEASURE, CLOTH FOR BACTERIUM-COUNTERMEASURE, CLOTH, CLOTHING ARTICLE, MEDICAL MEMBER, CHARGE-GENERATING THREAD THAT ACTS ON LIVING BODY, AND CHARGE-GENERATING THREAD FOR SUBSTANCE-ADSORPTION

CROSS REFERENCE TO RELATED APPLICATIONS

The present application is a continuation of International application No. PCT/JP2017/017237, filed May 2, 2017, which claims priority to International application No. PCT/JP2016/082416, filed Nov. 1, 2016, and International application No. PCT/JP2016/066749, filed Jun. 6, 2016, the entire contents of each of which are incorporated herein by reference.

FIELD OF THE INVENTION

The present invention relates to a thread having antibacterial property; and a cloth, a clothing article, or a medical member in which the thread is used.

BACKGROUND OF THE INVENTION

Many suggestions have been presented regarding fibrous materials having antibacterial properties (see Patent Documents 1 to 7).
  Patent Document 1: Japanese Patent No. 3281640
  Patent Document 2: Japanese Patent Application Laid-Open (JP-A-) No. H07-310284
  Patent Document 3: Japanese Patent No. 3165992
  Patent Document 4: Japanese Patent No. 1805853
  Patent Document 5: JP-A No. H08-226078
  Patent Document 6: JP-A No. H09-194304
  Patent Document 7: JP-A No. 2004-300650

SUMMARY OF THE INVENTION

However, the antibacterial effect of such materials has not been able to be sustained over a long term.
  Moreover, materials having antibacterial property may cause an allergenic reaction by, for example, a chemical agent contained therein.
  Thus, an object of this invention is to provide a charge-generating thread for bacterium-countermeasures which sustains an advantageous effect thereof over a longer period than conventional materials having antibacterial property, and which is further higher in safety than chemical agents and others.
  The charge-generating thread according to an aspect of the present invention includes a charge-generating fiber. The charge-generating fiber generates a charge by energy applied from the outside of the fiber.
  It has been hitherto known that the proliferation of bacillus and fungi can be restrained by an electric field (see, for example, Tetsuaki Tsuchido, Hiroki Kourai, Hideaki Matsuoka and Junichi Koizumi, "Microorganism Control—Science and Engineering, published by Kodansha Ltd.; and Koichi Takagi, "Application of High-Voltage Plasma Technique to Agricultural and Food Fields", J. HTSJ, vol. 51, No. 216). Moreover, an electric potential which generates this electric field may cause a current to flow in a current path made by, for example, moisture, and in a circuit formed by, for example, a local microscopic discharge phenomenon. This current would weaken bacteria to restrain the proliferation of the weakened bacteria. The charge-generating thread for bacterium-countermeasure according to an aspect of the present invention has a charge-generating fiber, which generates a charge by energy applied from the outside of the fiber. Thus, when the thread approaches or contacts gaps between thread lines or a human body or any other object that has a predetermined electric potential (examples thereof including the ground potential), the thread generates an electric field. Alternatively, when the charge-generating thread for bacterium-countermeasure of the present invention approaches or contacts gaps between thread lines or a human body or any other object that has a predetermined electric potential (examples thereof including the ground potential) through sweat or any other water content, the thread causes a current to flow therein.
  Accordingly, the charge-generating thread for bacterium-countermeasure according to an aspect of the present invention exhibits an antibacterial effect (effect of restraining the generation of bacteria) or a sterilizing effect (effect of sterilizing or killing bacteria) for reasons described below. When this thread is applied to any member that is used in the state of approaching or contacting a human body or any other object that has a predetermined electric potential (the member: a clothing article, a footwear article, or a medical article such as a face mask), an electric field or current is generated. By a direction effect of the electric field or current, problems are caused in cell membranes of bacteria, or electron transport systems of bacteria for life support, so that the bacteria are sterilized or the bacteria themselves are weakened. Furthermore, the electric field or current may change oxygen contained in water content to an active oxygen species. Alternatively, oxygen radials may be produced in cells of the bacteria by a stress environment based on the presence of the electric field or current; the bacteria are sterilized or weakened through the effects of the active oxygen species containing these radials. Moreover, these reasons may be combined with each other to generate an antibacterial effect or sterilizing effect.
  It is conceivable that the charge-generating fiber, which generates a charge by an energy from the outside of the fiber, is, for example, a fiber making use of, for example, a substance having a photoelectric effect, a substance having pyroelectric effect, or a piezoelectric substance. The following structure also forms a charge-generating fiber: a structure in which an electroconductive body is used as a core thread, an insulator is wound on the electroconductive body, and further a voltage is applied to the electroconductive body to generate a charge.
  When the piezoelectric substance is used, piezoelectricity generates an electric field so that no power source is required and no electric shock is favorably caused. Moreover, the lifespan of the piezoelectric substance is sustained longer than the period of an antibacterial effect of any chemical agent or the like. Furthermore, the piezoelectric substance is less likely to cause a risk of generating an allergenic reaction than any chemical agent.
  The following cloth also can individually generate an electric field or a current to produce an antibacterial effect: a cloth including a first charge-generating fiber that generates a positive charge and a second charge-generating fiber that generates a negative charge.
  Aspects of the present invention make it possible to realize a charge-generating thread for bacterium-countermeasure which sustains an advantageous effect thereof over

DETAILED DESCRIPTION OF THE INVENTION

Figure 1A:
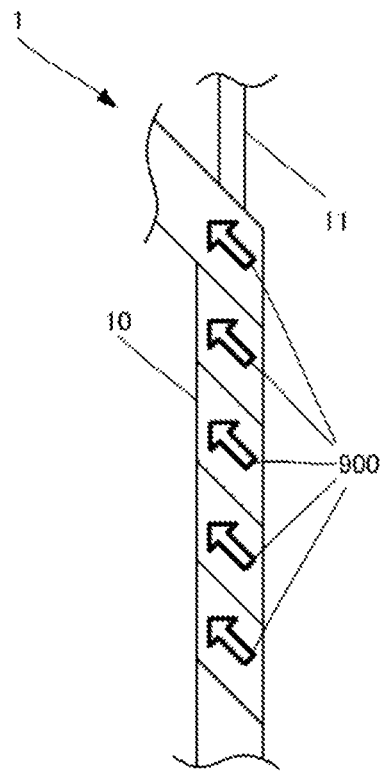
FIG. 1(A) is a view illustrating a structure of a piezoelectric thread 1.
Figure 1B:
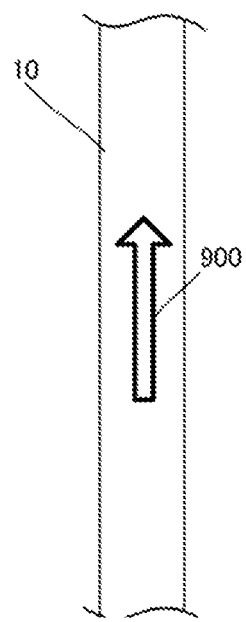
FIG. 1(B) is a plan view of a piezoelectric film 10.

FIG. 1(A) is a partial exploded view illustrating a structure of a piezoelectric thread 1, and FIG. 1(B) is a plan view of a piezoelectric film 10. The piezoelectric thread 1 is an example of a charge-generating fiber that generates a charge by an energy from the outside of the fiber.

The piezoelectric thread 1 is a thread in which the piezoelectric film 10 is wound on a core thread 11. The piezoelectric film 10 is an example of a piezoelectric substance. The core thread 11 is appropriately selected from any natural fiber or chemical fiber. Examples of the natural fiber include plant fiber, animal fiber, and polylactic acid. Examples of the plant fiber include cotton, and hemp. When polylactic acid is used as the core thread 11, it is unnecessary that the core thread 11 is piezoelectric polylactic acid. As will be detailed later, when polylactic acid is used for the piezoelectric film 10, the film 10 and the core thread 11 are identical with each other in material, so that these two 10 and 11 are high in affinity with each other. Examples of the chemical fiber include the synthetic fiber, glass fiber, and carbon fiber. The chemical fiber is stronger than the natural fiber.

The core thread 11 may be an electroconductive thread, which has electroconductivity. In the case of rendering the core thread 11 an electroconductive thread, at the time of inspecting the piezoelectricity of the piezoelectric thread 1, a measurement can be made about charges generated in the piezoelectric thread 1, using the core thread 11 and electrodes formed on portions of the outer circumference of the piezoelectric thread 1. This makes it possible to inspect the piezoelectric performance of the piezoelectric film 10 used in the piezoelectric thread 1. By short-circuiting lines of the electroconductive thread with each other, a circuit is evidently formed between any two of the lines so that an electric field generated between surfaces of the individual lines is dramatically increased. Moreover, in the use of an electroconductive body for the core thread 11, when a current is caused to flow into the core thread 11, a thread in which a charge is generated by an energy from the outside can be realized even by a structure in which an insulator other than the piezoelectric film 10 is wound on the core thread 11.

The core thread 11 is not an essential member. Even when the core thread 11 is not used, a piezoelectric thread (spiral thread) can be gained by turning the piezoelectric film 10 spirally. When the core thread 11 is not used, the spiral thread becomes a hollow thread to be improved in temperature-keeping power. When the spiral thread itself is impregnated with an adhesive agent, the resultant can be improved in strength.

The piezoelectric film 10 is made of, for example, a piezoelectric polymer. Piezoelectric films can be classified into films having pyroelectricity, and films having no pyroelectricity. For example, PVDF (polyvinylidene fluoride) is pyroelectric to generate charges also by a change in temperature. In PVDF or any other piezoelectric substance having pyroelectricity, charges are generated in its surface also by thermal energy from a human body.

Polylactic acid (PLA) is a piezoelectric film having no pyroelectricity. Polylactic acid is monoaxially drawn to generate piezoelectricity. Polylactic acid can be divided to PLLA, which is obtained by polymerizing an L-body monomer, or PDLA, which is obtained by polymerizing a D-body monomer.

Polylactic acid is a chiral polymer, and its main chain has a spiral structure. When polylactic acid is monoaxially drawn to orient molecules thereof, the polymer expresses piezoelectricity. When the polymer is further subjected to thermal treatment to be heightened in crystallization degree, the polymer is made high in piezoelectric constant. About the piezoelectric film 10 made of monoaxially drawn polylactic acid, the thickness direction thereof and a drawn direction 900 thereof are defined as a first axis and a third axis of the film, respectively, and further the direction orthogonal to both of the first axis and the third axis is defined as a second axis of the film. In this case, the piezoelectric film 10 has tensor components $d_{14}$ and $d_{25}$ as piezoelectric strain constants. Accordingly, when polylactic acid is strained along a direction of 45° angle to the monoaxially drawn direction, charges are generated.

Figure 2A:
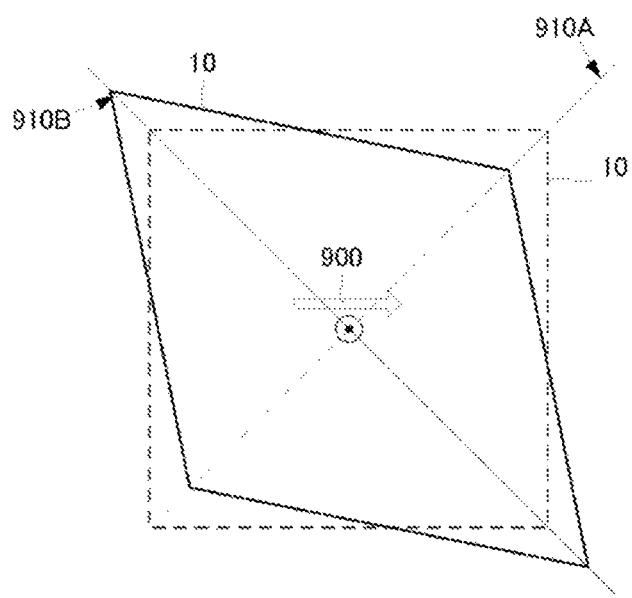
FIGS. 2(A) and 2(B) are views showing relationships among a monoaxially drawn direction of polylactic acid, the direction of an electric field to the acid, and the deformation of a piezoelectric film 10.
Figure 2B:
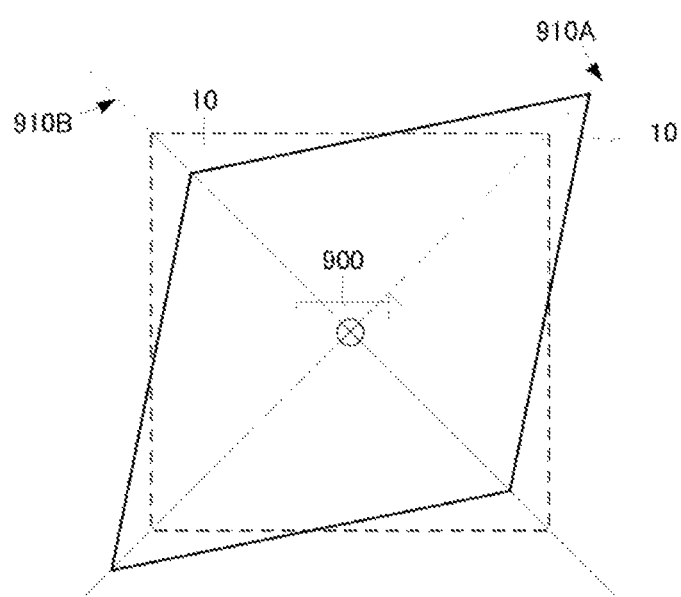

FIGS. 2(A) and 2(B) are views showing relationships among the monoaxially drawn direction of polylactic acid, the direction of an electric field to the acid, and deformation of the piezoelectric film 10. As illustrated in FIG. 2(A), when the piezoelectric film 10 contracts in the direction of a first diagonal line 910A and further expands in the direction of a second diagonal line 910B, which is orthogonal to the first diagonal line 910A, an electric field is generated in a direction from the rear side of the paper surface of FIG. 2(A) to the front side thereof. In short, in the piezoelectric film 10, negative charges are generated on the front side of the paper surface. As illustrated in FIG. 2(B), also when the piezoelectric film 10 expands in the direction of the first diagonal line 910A and further contracts in the direction of the second diagonal line 910B, charges are generated. However, the polarity thereof is reverse to the above. Thus, an electric field is generated in the direction from the front side of the paper surface toward the rear side thereof. In short, in the piezoelectric film 10, positive charges are generated on the front side of the paper surface.

Polylactic acid is subjected to molecular-orientating treatment based on drawing to generate piezoelectricity. Thus, the acid is not required to be subjected to polling treatment, unlike other piezoelectric polymers such as PVDF, or piezoelectric ceramics. The piezoelectric constant of monoaxially drawn polylactic acid is from about 5 to 30 pC/N to be a very high piezoelectric constant out of respective piezoelectric constants of polymers. Furthermore, the piezoelectric constant of polylactic acid is not varied with time to be very stable.

The piezoelectric film 10 is produced by cutting out a monoaxially drawn polylactic acid sheet as described above into a width of about 0.5 to 2 mm. As illustrated in FIG. 1(B), about the piezoelectric film 10, the long axis direction thereof is consistent with the drawn direction 900. As shown in FIG. 1(A), the piezoelectric film 10 turns into the piezoelectric thread 1 of a leftward spiraled thread (hereinafter referred to as an S thread), which has been leftward spiraled onto the core thread 11, so as to be twisted. The drawn direction 900 is in the state of being inclined leftward at an angle of 45 degrees to the axial direction of the piezoelectric thread 1.

Figure 3:
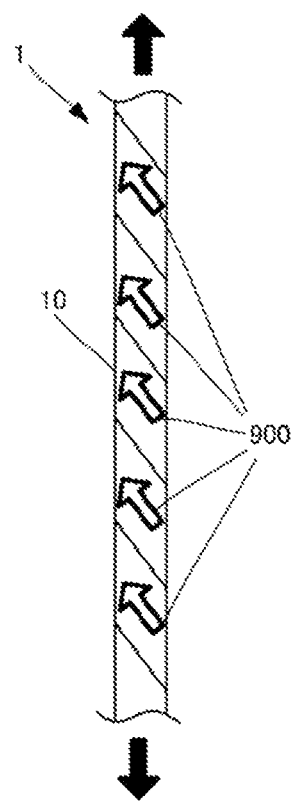
FIG. 3 is a view illustrating the piezoelectric thread 1 to which external force is applied.

As illustrated in FIG. 3, therefore, when external force (e.g., tension) is applied to the piezoelectric thread 1, the piezoelectric film 10 turns into a state illustrated in FIG. 2(A) to generate, on the surface thereof, negative charges.

When external force is applied to the piezoelectric thread 1 in such a way, negative charges are generated on the surface thereof and positive charges are generated inside the thread. Consequently, in the piezoelectric thread 1, an electric field is generated by a potential difference generated by the charges. This electric field leaks into a near space to form together with the other spatial portion a bonded electric field. Moreover, when the piezoelectric thread 1 approaches or contacts a near human body or any other near object having a predetermined electric potential (examples thereof including the ground potential), the potential generated in the piezoelectric thread 1 causes the generation of an electric field between the thread and the object.

It has been hitherto known that the proliferation of bacillus and fungi can be restrained by an electric field (see, for example, Tetsuaki Tsuchido, Hiroki Kourai, Hideaki Matsuoka and Junichi Koizumi, "Microorganism Control—Science and Engineering, published by Kodansha Ltd.; and Koichi Takagi, "Application of High-Voltage Plasma Technique to Agricultural and Food Fields", J. HTSJ, vol. 51, No. 216). Moreover, an electric potential which generates the electric field may cause a current to flow in a current path made by, for example, moisture, and in a circuit formed by, for example, a local microscopic discharge phenomenon. This current would weaken the bacteria to restrain the proliferation of the bacteria. Examples of the bacteria referred to in the present embodiment include bacillus, fungi, mites, fleas, and other fine- or micro-organisms.

Accordingly, the piezoelectric thread 1 directly exhibits an antibacterial effect or sterilizing effect by an electric field created near the piezoelectric thread 1 or by an electric field generated when the piezoelectric thread 1 approaches or contacts a human body or any other object having a predetermined electric potential. Alternatively, when the piezoelectric thread 1 approaches or contacts a different fiber near this thread, or a human body or any other object that has a predetermined electric potential through sweat or any other water content, the thread causes a current to flow therein. Also by the current, this thread may directly exhibit an antibacterial effect or sterilizing effect. Alternatively, the thread may indirectly exhibit an antibacterial effect or sterilizing effect through active oxygen species obtained by a change of oxygen contained in water content by effect of the current or voltage, and through radical oxygen species or other antibacterial chemical species (such as amine derivatives) generated by interaction with an additive contained in the fiber or generated by a catalytic effect. Alternatively, oxygen radials may be produced in cells of the bacteria by a stress environment based on the presence of the electric field or current. In this way, the piezoelectric thread 1 may indirectly exhibit an antibacterial effect or sterilizing effect. As the radicals, super oxide anion radicals (active oxygen) or hydroxy radicals would be generated.

A charge-generating thread as described above including a charge-generating fiber, which generates a charge by an energy from the outside, may be applied to various articles of clothing, medical members, and other products. The charge-generating thread is applicable to, for example, any one of the following: underclothes (particularly, socks), towels, insoles for shoes, boots and others, entire sports clothes, hats and caps, bedclothes (such as futons (Japanese bedclothes), mattresses, bed sheets, pillows, and pillow covers), toothbrushes, flosses, various filters (such as filters for water purifiers, air conditioners, and air cleaners), stuffed toys, pet-related goods (mats for pets, clothing articles for pets, and inners for pet clothing articles), various mat articles (legs, hands, and lavatory seats), curtains, kitchen utensils (such as sponges and dish towels), seats (seats for automobiles, electric trains, airplanes, and others), buffer materials and exterior materials for helmets for motorcycles, sofas, bandages, gauze pieces, masks, suture threads, clothing articles for doctors and patients, supporters, sanitary articles, sports goods (such as wears, inners for gloves, and gauntlets used in martial arts), and packing materials.

Out of clothing articles, particularly, socks (or supporters) are indispensably contracted by walking or some other motion of the user, along his/her joint, so that the piezoelectric thread 1 generates charges at a high frequency. Moreover, socks absorb sweat or any other water content to become a hotbed for the proliferation of bacteria. However, the piezoelectric thread 1 can restrain the proliferation of bacteria to produce a remarkable advantageous effect for bacterium-countermeasure-articles for deodorization.

Moreover, the present invention is usable to restrain bacteria on body surfaces of an animal other than humans. It is allowable to arrange a piezoelectric-substance-containing cloth onto at least one region of skin of the animal to face the region, and restrain the proliferation of bacteria on the body surface of the animal, which faces the cloth, by electric charges generated when an external force is applied onto the piezoelectric substance. This case makes it possible to restrain the proliferation of the bacteria on the body surface of the animal and cure the body surface of the animal from Trichophyton in a simple and easy manner that is higher in safety than the manner of using any medicine or the like.

Figure 4A:
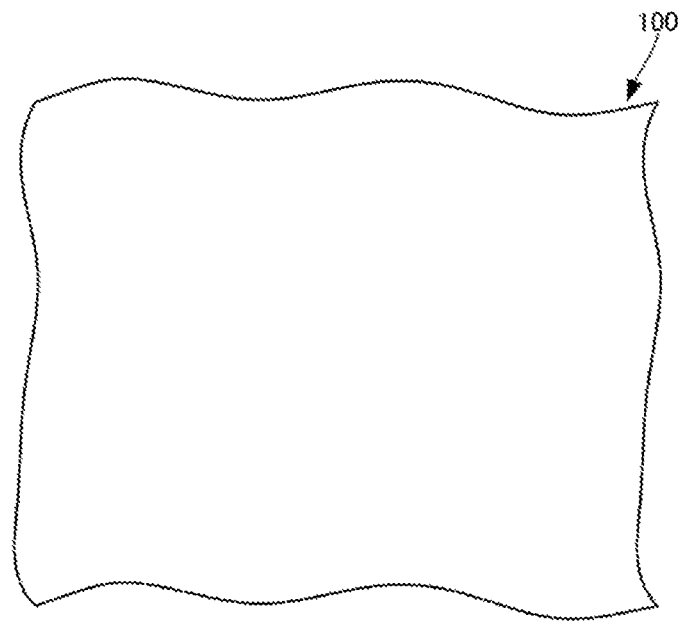
FIG. 4(A) is a schematic plan view of a cloth 100.
Figure 4B:
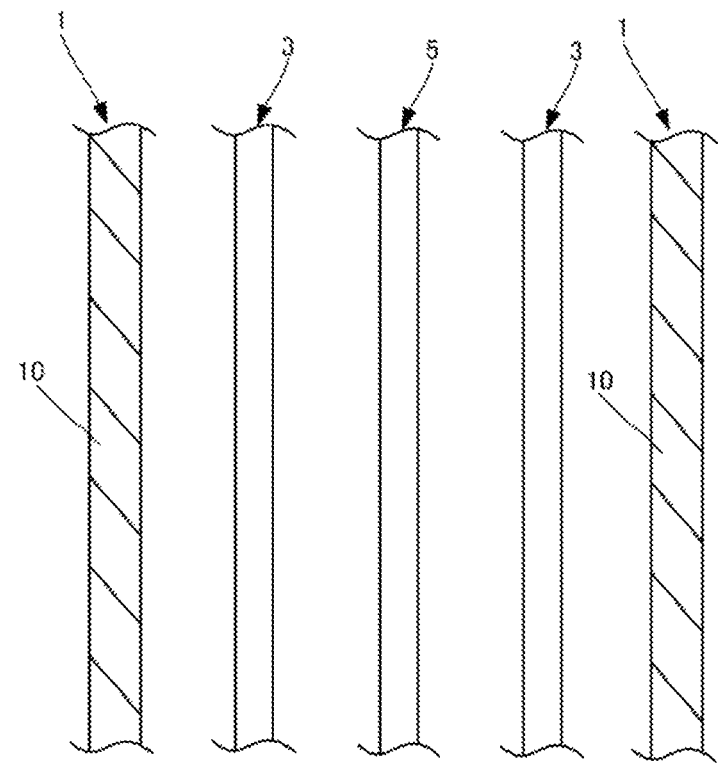
FIG. 4(B) is a view illustrating an arrangement of individual lines of the thread.

A cloth 100 into which the piezoelectric thread 1 is woven also functions as a cloth for bacterium-countermeasure. FIG. 4(A) is a schematic plan view of the cloth 100, and FIG. 4(B) is a view illustrating an arrangement of individual lines of the thread. The cloth 100 is a cloth in which lines of a piezoelectric thread (first thread) 1, lines of an ordinary thread 3, and lines of an electroconductive thread (second thread) 5 are woven into each other. The ordinary thread 3 is a thread to which a piezoelectric substance is not fitted, and corresponds to a dielectric substance. As described above, the ordinary thread 3 is made of a natural fiber or chemical fiber. However, the ordinary thread 3 is not an essential constituent for the present invention.

The electroconductive thread 5, which is the second thread, is made of an electroconductive substance (electroconductive fiber). The electroconductive fiber may be, for example, a fiber plated with carbon, a metal itself (fine wire), a slit ribbon, a polyester fiber having an electroless-plated surface, or a product obtained by making a polyester film having vapor-deposited electrodes into a slit ribbon form.

The electroconductive thread 5 is an electroconductive substance to have a predetermined uniform electric potential (examples thereof including the ground potential). The lines of the piezoelectric thread 1 are arranged, by a predetermined distance, apart from the lines of the electroconductive thread 5 to interpose therebetween one or more of the lines of the ordinary thread 3, which corresponds to a dielectric substance. In a case where this electroconductive thread 5 has a forcibly fixed potential, such as the ground potential, at the time of applying external force to the piezoelectric thread 1, a potential difference between the electroconductive thread 5, which has the predetermined electric potential, and the piezoelectric thread 1, which generates electric charges, causes the generation of an electric field between the two. However, the ordinary thread 3 is not an essential constituent. Even when the ordinary thread 3 is not used, an electric field is generated between the piezoelectric thread 1 and the electroconductive thread 5. The electroconductive thread 5 may fulfil a role as a reference potential line. For example, when electric charges are generated in the piezoelectric thread 1, a potential difference distribution is generated in a cross section of the thread. In the cross section, at its region near the electroconductive thread 5 the potential thereof is defined as the reference potential. At a region distant therefrom, a potential difference is generated from the reference potential correspondingly to the electric charges generated therein. This potential is a potential relative to the reference potential. When a potential difference is evidently defined not only inside the piezoelectric thread but also in the space, an electric field is created correspondingly to this potential difference. In this way, an electric field may be formed between lines of the piezoelectric thread 1. Considering this matter, it is not desirable to arrange the electroconductive thread 5 in such a manner that the potential generated therein is cancelled by the shift of the electric charges. Specifically, under conditions that any ordinary thread 3 is omitted in FIG. 4(B), the arrangement of thread lines are preferably an arrangement in which the following lines are located in an order described herein: an electroconductive thread line, a piezoelectric thread line, a piezoelectric thread line, an electroconductive thread line, a piezoelectric thread line, a piezoelectric thread line, and an electroconductive thread line. Moreover, preferably, the electroconductive thread lines are short-circuited to each other and made equal in potential to each other. Furthermore, preferably, with any adjacent two of the piezoelectric thread lines, polarities of electric charges generated on their outsides in response to external force are reverse to each other. When an external force is applied to the arrangement, the arrangement causes the generation of a clear potential difference between any near two or contacting two of the piezoelectric thread lines so that an electric field is generated. WO 2015/159832 publicly discloses a transducer in which a plurality of piezoelectric thread lines and a plurality of electroconductive thread lines are used to produce a knitting or woven fabric, and the fact that a displacement is given to this knitting or fabric is sensed. In this case, all the electroconductive thread lines are connected to a detecting sensor. For any one of the piezoelectric thread lines, paired electroconductive thread lines, out of the electroconductive thread lines, are inevitably present. When electric charges are generated in the piezoelectric thread line, the electric charges are shifted in the electroconductive thread lines to neutralize the generated electric charges immediately. The detecting circuit detects an electric current based on this electron shift to output a signal. Accordingly, in this case, the generated potential is immediately cancelled; therefore, the following is not caused: a strong electric field is created between the piezoelectric thread line and the electroconductive thread lines, or between the piezoelectric thread line and any one of the other piezoelectric thread lines. Consequently, no antibacterial effect is exhibited.

The lines of the piezoelectric thread 1 are arranged very closely to those of the electroconductive thread 5 so that the distance therebetween is approximately zero. The intensity of any electric field, as is represented by $E=V/d$, becomes larger in inverse proportion to the distance between substances generating charges. Thus, the intensity of the electric field generated by the cloth 100 becomes a very large value. This electric field is created by mutual bonding between electric fields generated inside the lines of the piezoelectric thread 1 and electric fields generated inside lines of a piezoelectric thread 2. As the case may be, by water content containing an electrolyte such as sweat, a circuit may be formed as an actual current path. In a cloth in which filaments of a fiber are knitted, fiber filaments are complicatedly entangled with each other, so that a case may be generated where an electric field generated in one portion of the lines of the piezoelectric thread 1 is mutually bonded to an electric field generated in another portion of those of the piezoelectric thread 1. In the same manner, a case may be generated where an electric field generated in one portion of the lines of the piezoelectric thread 2 is mutually bonded to an electric field generated in another portion of those of the piezoelectric thread 2. Even when the intensity of the electric field is macroscopically zero or very weak, the electric field may be microscopically an aggregate of intense electric fields having vector directions reverse to each other. About these phenomena, substantially the same description can be made even in a cloth made only of the piezoelectric thread 1, a cloth made only of the piezoelectric thread 2, or a cloth made by weaving, into the piezoelectric thread(s) 1 and/or 2, an ordinary thread or electroconductive thread simultaneously.

Thus, the cloth 100 functions as a cloth generating an electric field. In the cloth 100, a current may flow between the lines of the piezoelectric thread 1 and the lines of the electroconductive thread 5 through water content such as sweat. Also by this current, the cloth may also exhibit an antibacterial effect or sterilizing effect. Alternatively, the cloth may indirectly exhibit an antibacterial effect or sterilizing effect through active oxygen species obtained by a change of oxygen contained in water content by the current or voltage, and through radical species or other antibacterial chemical species (such as amine derivatives) generated by interaction with an additive contained in the fiber or by a catalytic effect. Alternatively, oxygen radials may be produced in cells of bacteria by a stress environment based on the presence of the electric field or current. In this way, an antibacterial effect or sterilizing effect may be indirectly exhibited.

The cloth 100 exhibits an antibacterial effect or sterilizing effect by an electric field which the cloth itself generates and a change in the intensity thereof, or by the current. Alternatively, the cloth exhibits an antibacterial effect or sterilizing effect by, for example, radical species generated by effect of the current or voltage.

Furthermore, when the electroconductive thread 5 elutes out therefrom a metal ion (such as $Ag^+$, $Zn^{2+}$ or $Cu^{2+}$), the metal ion eluted out from the electroconductive thread 5 makes the antibacterial effect or sterilizing effect higher. In the cloth 100, even when the lines of the piezoelectric thread 1 have spots from which no charge is generated, charges generated locally by the electroconductive thread 5 are carried to the whole of the cloth so that the cloth wholly exhibits an antibacterial effect or sterilizing effect. Moreover, when the electroconductive thread 5 is connected to a measuring instrument such as an oscilloscope, it can be examined whether or not the piezoelectric thread 1 functions (whether or not charges are generated) (for example, delivery inspection can be made). When an electroconductive body from which a metal ion elutes out is used for the core thread 11, the core thread 11 functions as an electroconductive fiber from which a metal ion elutes out. Thus, it is unnecessary to set any electroconductive thread separately from the piezoelectric thread 1.

Figure 5:
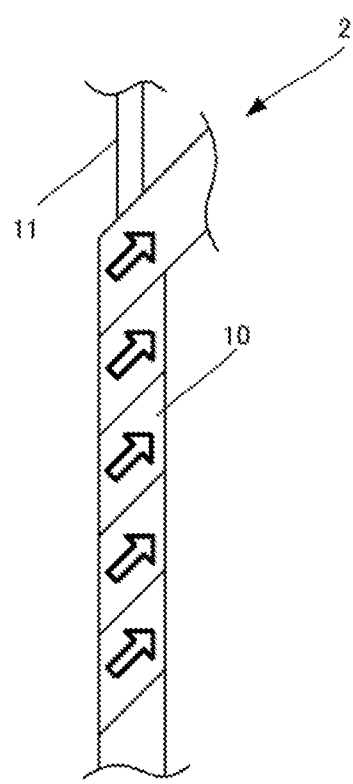
FIG. 5 is a view illustrating a structure of a piezoelectric thread 2.

As described above, for example, a clothing article or medical member in which the cloth 100 is used exhibits an antibacterial effect or sterilizing effect. The piezoelectric thread used in the cloth 100 may be a rightward spiraled piezoelectric thread 2 (hereinafter referred to as a Z thread) as illustrated in FIG. 5. Since the piezoelectric thread 2 is the Z thread, the drawn direction 900 thereof is in the state of being inclined rightward at an angle of 45 degrees to the axial direction of the piezoelectric thread 1. Accordingly, when external force is applied to the piezoelectric thread 2, the piezoelectric film 10 turns into a state illustrated in FIG. 2(B) to generate, on the surface thereof, positive charges. Thus, when the piezoelectric thread 2 also approaches or contacts a human body or any other object that has a predetermined electric potential (examples thereof including the ground potential), the thread generates an electric field. Alternatively, when the piezoelectric thread 2 approaches or contacts a human body or any other object that has a predetermined electric potential (examples thereof including the ground potential) through sweat or any other water content, the thread causes a current to flow therein.

Any one of the piezoelectric threads is produced by any known method. For example, the following method is adoptable: a method of extruding and shaping, for example, a piezoelectric polymer to be made into a fibrous form as a fiber, as well as a covering thread including a slit film; a method of melt-spinning a piezoelectric polymer to be made into a fibrous form (for example, a spinning and drawing method in which a spinning step and a drawing step are performed separately from each other, a direct drawing method in which a spinning step and a drawing step are linked to each other, a POY-DTY method in which a false twisting step can also be attained at the same time, or a super high speed spinning method in which the spinning speed is made high); a method of dry- or wet-spinning a piezoelectric polymer to be made into a fibrous form (for example, a phase-separating method or dry- or wet-spinning method of dissolving a polymer, which is a raw material, into a solvent, and extruding out the solution through a nozzle to be made into a fibrous form, a liquid crystal spinning method of making a polymer into a gel form in the state the polymer contains a solvent, so as to be evenly made into a fibrous form, or a liquid crystal spinning method of using a solution of a liquid crystal or a melted body thereof to make the liquid crystal into a fibrous form); or a method of spinning a piezoelectric polymer electrostatically to be made into a fibrous form.

Many bacteria have negative charges. Thus, the cloth having the piezoelectric thread 2 can adsorb a great number of bacteria through generated positive charges. Moreover, the cloth having the piezoelectric thread 2 can inactivate bacteria having negative charges through the generated positive charges. In such a way, a cloth using a piezoelectric thread generating, on the surface thereof, positive charges has a great advantageous effect as a piezoelectric thread for bacterium-countermeasure.

The piezoelectric thread 1 or 2 (or the cloth having at least one of the piezoelectric threads 1 and 2) has use purposes described below besides the bacterium-countermeasure purpose.

(1) Piezoelectric Thread That Acts on a Living Body

Many tissues which are included in a living body have piezoelectricity. For example, collagen, which is included in a human body, is a kind of protein. Collagen is included in, for example, blood vessels, coria, ligaments, tendons, bones or cartilages in a large proportion. Collagen is a piezoelectric substance, so that a tissue in which collagen is oriented may show a very large piezoelectricity. About the piezoelectricity of bones, many reports have been already made (see, for example, Eiichi Sakata, "Piezoelectricity of Biopolymer", Polymer vol. 16 (1967), No. 9, pp. 795-800). Accordingly, when an electric field is generated by the cloth having the piezoelectric thread 1 or 2 and then the electric field is alternated or is changed in intensity, the piezoelectric substance of the living body is vibrated by a reverse piezoelectric effect. The alternated electric field generated by the piezoelectric thread(s) 1 and/or 2, or the electric field intensity change applies micro-vibration to a part of the living body, for example, capillary blood vessels or the corium thereof, so that an improvement of blood flow in the part can be promoted. This may promote the recovery of, for example, skin diseases or injuries. Accordingly, the piezoelectric thread functions as a piezoelectric thread that acts on a living body. WO 2015/159832 publicly discloses a transducer in which a plurality of piezoelectric thread lines and a plurality of electroconductive thread lines are used to produce a knitting or woven fabric, and the fact that a displacement is given to this knitting or fabric is sensed. In this case, all the electroconductive thread lines are connected to a detecting sensor. For any one of the piezoelectric thread lines, paired electroconductive thread lines, out of the electroconductive thread lines, are inevitably present. When electric charges are generated in the piezoelectric thread line, the electric charges are shifted in the electroconductive thread lines to neutralize the generated electric charges immediately. The detecting circuit detects an electric current based on this electron shift to output a signal. Accordingly, in this case, the generated potential is immediately cancelled; therefore, the following is not caused: a strong electric field is created between the piezoelectric thread line and the electroconductive thread lines, or between the piezoelectric thread line and any one of the other piezoelectric thread lines. Consequently, no curing effect is exhibited.

(2) Piezoelectric Thread for Substance-Adsorption

As described above, when external force is applied to the piezoelectric thread 1, the thread generates negative charges.

When external force is applied to the piezoelectric thread 2, the thread generates positive charges. Thus, the piezoelectric thread 1 has a nature of adsorbing a substance having positive charges (such as particles of, for example, pollen), and the piezoelectric thread 2 has a nature of adsorbing a substance having negative charges (such as a harmful substance, for example, yellow sand). Accordingly, when the cloth having the piezoelectric thread 1 or 2 is applied to, for example, a medical article such as a face mask, this cloth-applied article can adsorb fine particles of pollen or yellow sand. WO 2015/159832 publicly discloses a transducer in which a plurality of piezoelectric thread lines and a plurality of electroconductive thread lines are used to produce a knitting or woven fabric, and the fact that a displacement is given to this knitting or fabric is sensed. In this case, all the electroconductive thread lines are connected to a detecting sensor. For any one of the piezoelectric thread lines, paired electroconductive thread lines, out of the electroconductive thread lines, are inevitably present. When electric charges are generated in the piezoelectric thread line, the electric charges are shifted in the electroconductive thread lines to neutralize the generated electric charges immediately. The detecting circuit detects an electric current based on this electron shift to output a signal. Accordingly, in this case, the generated potential is immediately cancelled; therefore, the following is not caused: a strong electric field is created between the piezoelectric thread line and the electroconductive thread lines, or between the piezoelectric thread line and any one of the other piezoelectric thread lines. Consequently, no adsorbing effect is exhibited.

Figure 6A:
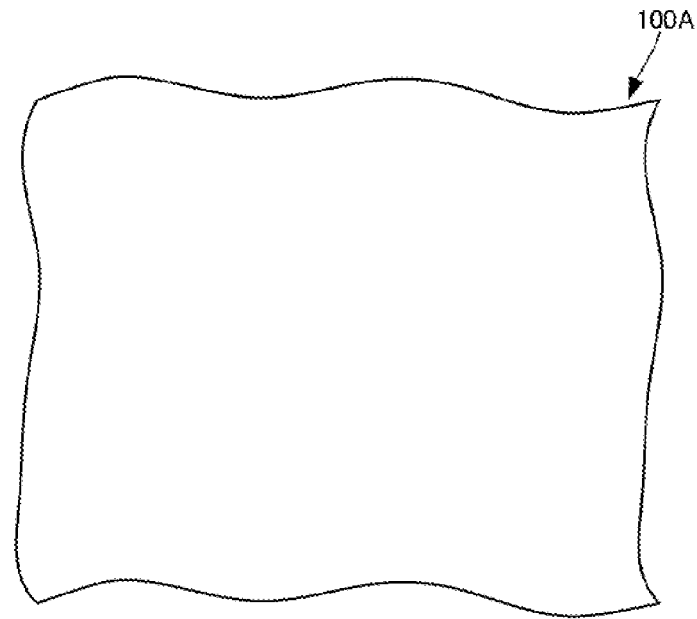
FIG. 6(A) is a schematic plan view of a cloth 100A.
Figure 6B:
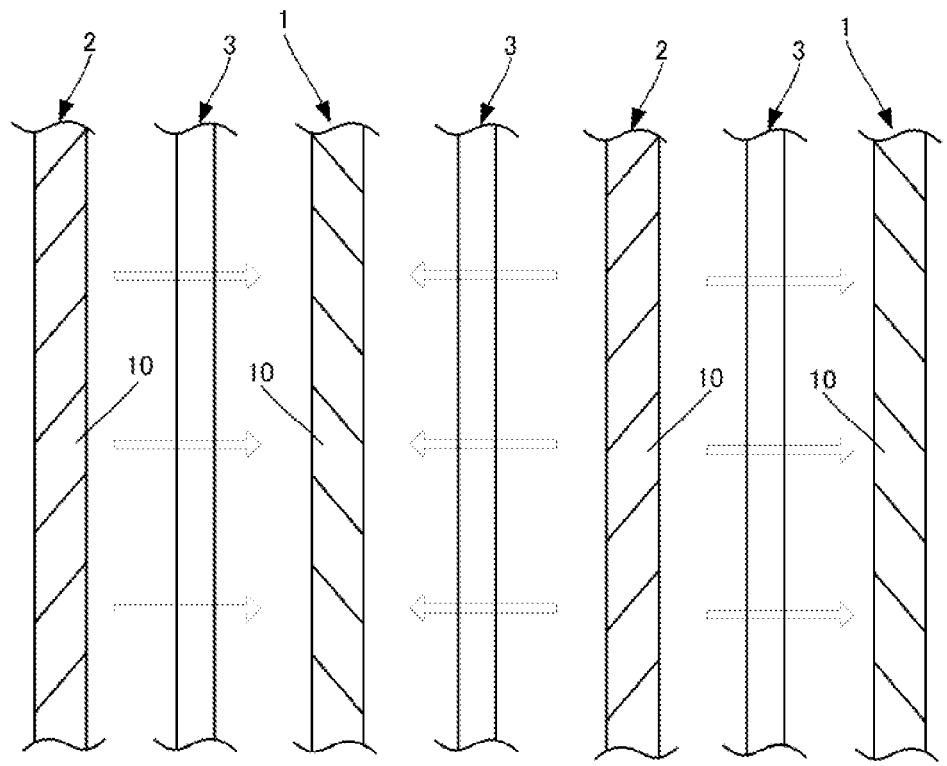
FIG. 6(B) is a view illustrating an electric field generated between individual lines of threads.

Next, FIG. 6(A) is a schematic plan view of a cloth 100A, and FIG. 6(B) is a view illustrating an electric field generated between individual lines of threads. The respective directions of all arrows in an electric field in FIG. 6B are reversed (a detailed description of which is set forth below).

In the cloth 100A illustrated in FIGS. 6(A) and 6(B), lines of a piezoelectric thread (first thread) 1, lines of a piezoelectric thread (second thread) 2, and lines of an ordinary thread 3 are woven into each other. The ordinary thread 3 is a thread to which a piezoelectric substance is not fitted, and corresponds to a dielectric substance.

In the example in FIG. 6(B), the lines of the piezoelectric thread (first thread) 1, those of the piezoelectric thread (second thread) 2, and those of the ordinary thread 3 are arranged in parallel with each other. The lines of the piezoelectric thread 1 are arranged, by a predetermined distance, apart from those of the piezoelectric thread 2 to interpose therebetween one or more of those of the ordinary thread 3, which corresponds to a dielectric substance. The piezoelectric thread 1 is different in the polarity of generated charges from the piezoelectric thread 2. A difference in electric potential between individual spots thereof is defined by an electric-field-bonding circuit formed by the matter that the lines are complicatedly entangled with each other, or defined by a circuit made of a current path formed incidentally in the thread lines by, for example, water content. Accordingly, when external force is applied to the lines of the threads, an electric field represented by outlined arrows in FIG. 6(B) is generated between the lines of the piezoelectric thread 2 generating positive charges and those of the piezoelectric thread 1 generating negative charges. However, the ordinary thread 3 is not an essential constituent. Even when the ordinary thread 3 is not used, an electric field is generated between the lines of the piezoelectric thread 1 and those of the piezoelectric thread 2. In a case where the piezoelectric thread 1 (S thread) and the piezoelectric thread 2 (Z thread) are made of PLLA, at the time of applying tension to the piezoelectric thread 1 alone, the surface thereof turns negative in potential and the inside thereof turns positive in potential. Conversely, at the time of applying tension to the piezoelectric thread 2 alone, the surface thereof turns positive in potential and the inside thereof turns negative in potential. When these threads approach or contact each other, their approach or contact regions (surfaces) turn to the same potential. In this case, the potential of the approach or contact regions (surfaces) of the piezoelectric threads 1 and 2 becomes 0 V, and the positive potential of the inside of the piezoelectric thread 1 becomes higher to keep the original potential difference. In the same way, the negative potential of the inside of the piezoelectric thread 2 becomes lower. In any cross section of the piezoelectric thread 1, an electric field is created to be directed mainly outward from the center of the cross section. In any cross section of the piezoelectric thread 2, an electric field is created to be directed mainly inward from the center of the cross section. In spaces around these threads, leakage electric fields are created. These leakage electric fields are bonded to each other to create a strong electric field between the piezoelectric threads 1 and 2.

The lines of the piezoelectric thread 1 are arranged very closely to those of the piezoelectric thread 2 so that the distance therebetween is approximately zero. The intensity of any electric field, as is represented by $E=V/d$, becomes larger in inverse proportion to the distance between the substances generating charges. Thus, the intensity of the electric field generated by the cloth 100A becomes a very large value. This electric field is created by mutual bonding between electric fields generated inside the lines of the piezoelectric thread 1 and electric fields generated inside lines of the piezoelectric thread 2. As the case may be, by water content containing an electrolyte such as sweat, a circuit may be formed as an actual current path. In a cloth in which filaments of a fiber are knitted, fiber filaments are complicatedly entangled with each other, so that a case may be generated where an electric field generated in one portion of the lines of the piezoelectric thread 1 is mutually bonded to an electric field generated in another portion of those of the piezoelectric thread 1. In the same manner, a case may be generated where an electric field generated in one portion of the lines of the piezoelectric thread 2 is mutually bonded to an electric field generated in another portion of those of the piezoelectric thread 2. Even when the intensity of the electric field is macroscopically zero or very weak, the electric field may be microscopically an aggregate of intense electric fields having vector directions reverse to each other. About these phenomena, substantially the same description can be made even in a cloth made only of the piezoelectric thread 1, a cloth made only of the piezoelectric thread 2, or a cloth made by weaving, into the piezoelectric thread 1 and/or 2, an ordinary thread or electroconductive thread simultaneously.

Thus, the cloth 100A functions as a cloth generating an electric field. In the cloth 100A, a current may flow between the lines of the piezoelectric thread 1 and the lines of the piezoelectric thread 2 through water content such as sweat. By this electric field or current, the cloth may directly exhibit an antibacterial effect or sterilizing effect. Alternatively, the cloth may indirectly exhibit an antibacterial effect or sterilizing effect through active oxygen species obtained by a change of oxygen contained in water content by effect of the current or voltage, and through active oxygen species or other antibacterial chemical species (such as amine derivatives) generated by interaction with an additive contained in the fiber or by a catalytic effect. Alternatively, oxygen radials may be produced in cells of bacteria by a stress environment based on the presence of the electric field or current. In this way, an antibacterial effect or sterilizing effect may be indirectly exhibited.

As this example, an example has been described in which the piezoelectric thread 1 is different in the polarity of generated charges from the piezoelectric thread 2. However, even when piezoelectric threads having the same polarity are used, an electric field is generated or a current flows when an electric potential difference exists in the space. Alternatively, an electric current flows through an electroconductive medium therebetween.

The cloth 100A exhibits an antibacterial effect or sterilizing effect by an electric field which the cloth itself generates and a change in the intensity thereof, or by the current. Alternatively, the cloth exhibits an antibacterial effect or sterilizing effect by, for example, radical species generated by effect of the current or voltage. The cloth 100A may also have an electroconductive fiber that elutes out therefrom a metal ion. In this case, in the cloth 100A, in addition to an antibacterial effect or sterilizing effect by the electric field, the antibacterial effect or sterilizing effect is further heightened by the metal ion eluted out from the electroconductive thread 5. About the cloth 100A, even when the piezoelectric thread 1 has a spot where no charge is generated, this cloth exhibits an antibacterial effect or sterilizing effect through the metal ion eluted out from the electroconductive thread 5.

A clothing article using the cloth 100A or a medical member using this clothing article exhibits an antibacterial effect or sterilizing effect in the same manner. The clothing article using the cloth 100A, particularly, socks (or supporters) using the same also produce a remarkable advantageous effect for bacterium-countermeasure as described above. In the same manner as the above-mentioned piezoelectric thread that acts on a living body or the piezoelectric thread for substance-adsorption, the cloth 100A also functions as a piezoelectric cloth that acts on a living body or a piezoelectric cloth for substance-adsorption.

The cloth 100A exhibits an antibacterial effect or sterilizing effect through an electric field or current generated by the piezoelectric threads 1 and 2, which constitute this cloth itself, so that this cloth exhibits an antibacterial effect or sterilizing effect against bacteria shifted to the cloth 100A. Bacteria which cause offensive odor would live in gaps between fibers of the cloth. The cloth 100A can effectively exterminate such bacteria. On the skin of a human body, normal bacterial flora is present, which fulfills a role necessary for keeping the skin surface in a normal state. However, small is the possibility that the cloth 100A directly kills the normal bacterial flora to produce only a small risk of affecting the normal bacterial flora on the skin. Thus, the cloth is higher in safety.

Figure 7:
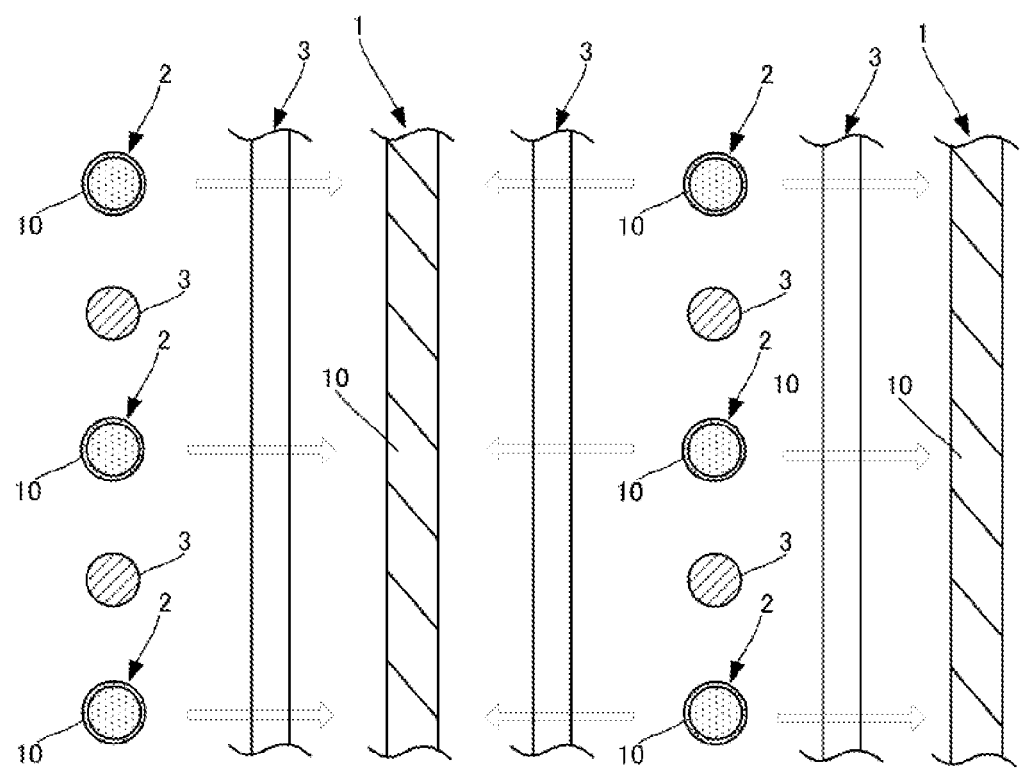
FIG. 7 is a view illustrating electric fields generated between individual lines of threads.

As illustrated in FIG. 7, even in the cloth 100A which is an embodiment in which lines of a piezoelectric thread 1, lines of a piezoelectric thread 2, and lines of an ordinary thread 3 are arranged to cross each other, electric fields are generated in positions where the lines of the piezoelectric thread 1 cross those of the piezoelectric thread 2.

In the above-mentioned examples, the descriptions have been made about a cloth (woven fabric) in which plural threads including a charge-generating thread are woven into each other. However, also in a cloth made of a knitted good (product in which rings made of plural threads including a charge-generating thread are hooked or hung with each other), electric fields are generated or a current flows in the same manner between lines of the threads in which an electric potential difference is generated. Thus, the knitted good produces an antibacterial effect or sterilizing effect.

In the present embodiment, as the example of the piezoelectric substance, a piezoelectric film has been described. However, the piezoelectric substance may be a product obtained by, for example, jetting out a piezoelectric material into a yarn from a nozzle, and then drawing the yarn (piezoelectric thread having a substantially circular sectional shape or a deformed sectional shape). A spinning method therefor may be, for example, wet spinning, dry spinning or melt spinning. For example, a polylactic acid (PLLA) piezoelectric thread is produced through melt spinning, highly drawing treatment, and thermal treatment (for crystallization). Also in the case of forming such a thread (multifilament thread) in which lines of a PLLA piezoelectric thread are twisted with each other and further applying tension to this tread, the following is caused: in an S thread as this thread, on its surface, negative charges are generated; and in a Z thread as the thread, on its surface, positive charges are generated. Such a thread can be merely rendered a twisted thread without using any core thread. Such a thread can be produced at low costs. The number of filaments of the multifilament is a design item which should be designed in light of the use of the thread. The number of times of the twisting is also a design item which should be appropriately designed. The filaments may each partially contain therein a filament which is not any piezoelectric substance. Moreover, the respective thicknesses of the filaments may not be uniform. Such modifications cause a deviation in a potential distribution generated in any cross section of the thread to break symmetry therein. Thus, between the S thread as the thread and the Z thread as the thread, an electric field is easily created.

Figure 8A:
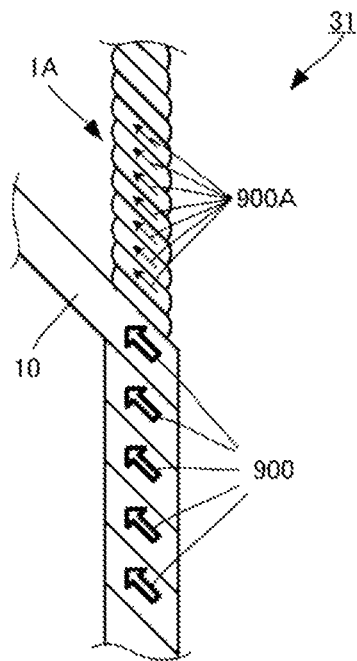
FIG. 8(A) is a partial exploded view illustrating a structure of a piezoelectric thread 31.
Figure 8B:
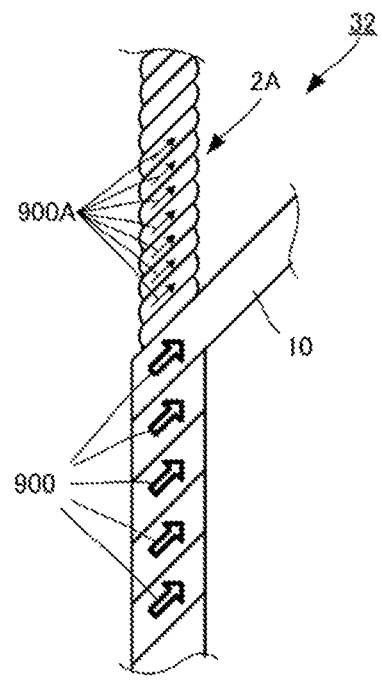
FIG. 8(B) is a partial exploded view illustrating a structure of a piezoelectric thread 32.

Next, FIG. 8(A) is a partial exploded view illustrating a structure of a piezoelectric thread 31, and FIG. 8(B) is a partial exploded view illustrating a structure of a piezoelectric thread 32.

In the piezoelectric thread 31, a piezoelectric film 10 is further wound on a piezoelectric covering thread 1A that is an S thread. In the piezoelectric thread 32, a piezoelectric film 10 is further wound on a piezoelectric covering thread 2A that is a Z thread. The piezoelectric thread 31 is a leftward spiraled thread (S thread) in which the piezoelectric film 10 is leftward spiraled onto the piezoelectric covering thread 1A. A drawn direction 900 thereof is in the state of being leftward inclined at an angle of 45 degrees to the axial direction of the piezoelectric thread 31. The drawn direction 900 is consistent with a drawn direction 900A of the piezoelectric covering thread 1A. The piezoelectric covering threads 1A and 2A may each a twisted thread having no core thread. A core thread of the thread 1A or 2A may be an electroconductive thread.

When the piezoelectric thread 31 is pulled in the axis direction thereof (when external force is applied thereto), negative charges are generated on the front surface of the piezoelectric covering thread 1A. In the meantime, positive charges are generated on the rear surface of the piezoelectric film 10, which is opposite to the front surface of the piezoelectric covering thread 1A. A difference in electric potential between individual spots thereof is defined by an electric-field-bonding circuit formed by the matter that lines of the thread are complicatedly entangled with each other, or defined by a circuit made of a current path formed incidentally in the thread lines by effect of, for example water content. When the circuit has been formed, the intensity of the electric field becomes larger in inverse proportion to the distance between the substances generating charges, so that the intensity of the electric field becomes very high, the field being generated between the front surface of the piezoelectric covering thread 1A and the rear surface of the piezoelectric film 10. In short, this structure makes the antibacterial effect or sterilizing effect of the thread itself higher. When the piezoelectric thread 31 is pulled in the axis direction thereof (when external force is applied thereto), negative charges are generated on the front surface of the piezoelectric thread 31 (the front surface of the piezoelectric film 10). Thus, by combining this thread 31 with a thread having a surface in which positive charges are generated, an electric field can also be further generated between the threads.

In the meantime, as illustrated in FIG. 8(B), the piezoelectric thread 32 is a right spiraled thread (Z thread) in which the piezoelectric film 10 is rightward spiraled onto the piezoelectric covering thread 2A. A drawn direction 900 thereof is in the state of being rightward inclined at an angle of 45 degrees to the axial direction of the piezoelectric thread 31. The drawn direction 900 is consistent with a drawn direction 900A of the piezoelectric covering thread 2A.

When the piezoelectric thread 32 is pulled in the axis direction thereof (when external force is applied thereto), positive charges are generated on the front surface of the piezoelectric covering thread 2A (the front surface of the piezoelectric film 10). Negative charges are generated on the rear surface of the piezoelectric film 10, which is opposite to the front surface of the piezoelectric covering thread 2A. A difference in electric potential between individual spots thereof is defined by a circuit formed by the matter that lines of the thread are complicatedly entangled with each other, or defined by a circuit made of a current path formed incidentally in the thread lines by, for example, water content. When the circuit has been formed, the intensity of the electric field becomes larger in inverse proportion to the distance between the substances generating charges, so that the intensity of the electric field becomes very high, the field being generated between the front surface of the piezoelectric covering thread 2A and the rear surface of the piezoelectric film 10. In short, in the same manner as the structure of the piezoelectric thread 31, this structure makes the antibacterial effect or sterilizing effect of the thread itself higher. When the piezoelectric thread 32 is pulled in the axis direction thereof (when external force is applied thereto), positive charges are generated on the front surface of the piezoelectric thread 32 (the front surface of the piezoelectric film 10A). Thus, in the same manner as in the piezoelectric thread 31, by combining this thread 32 with a thread having a surface in which negative charges are generated, an electric field can also be generated between the threads.

Figure 9A:
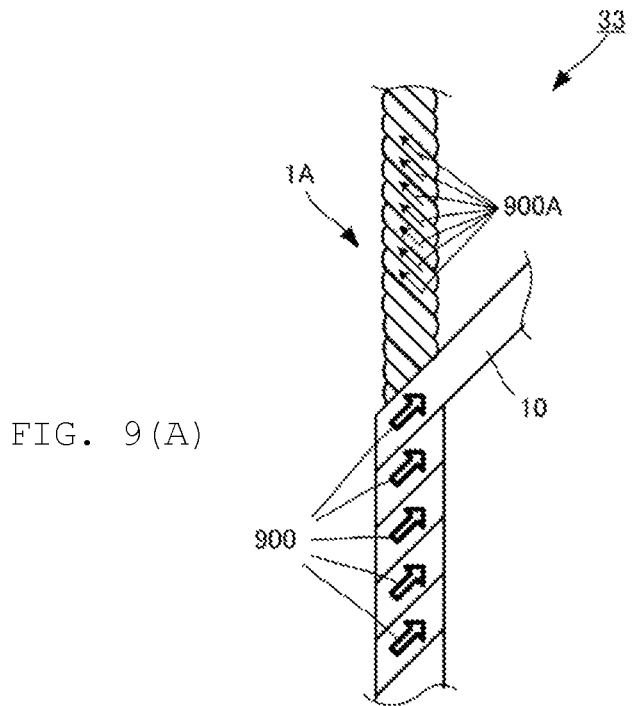
FIG. 9(A) is a partial exploded view illustrating a structure of a piezoelectric thread 33.
Figure 9B:
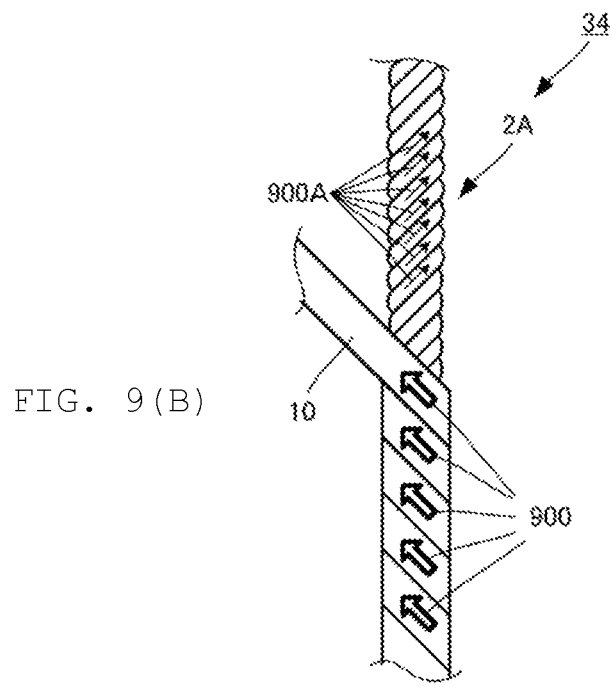
FIG. 9(B) is a partial exploded view illustrating a structure of a piezoelectric thread 34.

Next, FIG. 9(A) is a partial exploded view illustrating a structure of a piezoelectric thread 33, and FIG. 9(B) is a partial exploded view illustrating a structure of a piezoelectric thread 34.

In the piezoelectric thread 33, a piezoelectric film 10 is wound on a piezoelectric covering thread 1A. In the piezoelectric thread 34, a piezoelectric film 10 is wound on a piezoelectric covering thread 2A.

The piezoelectric thread 33 is a rightward spiraled thread (Z thread) in which the piezoelectric film 10 is rightward spiraled onto the piezoelectric covering thread 1A. A drawn direction 900 thereof is in the state of being rightward inclined at an angle of 45 degrees to the axial direction of the piezoelectric thread 33. The drawn direction 900 is different from a drawn direction 900A of the piezoelectric covering thread 1A.

As illustrated in FIG. 9(B), the piezoelectric thread 34 is a leftward spiraled thread (S thread) in which the piezoelectric film 10 is leftward spiraled onto the piezoelectric covering thread 2A. A drawn direction 900 thereof is in the state of being leftward inclined at an angle of 45 degrees to the axial direction of the piezoelectric thread 34. The drawn direction 900 is different from a drawn direction 900A of the piezoelectric covering thread 2A.

Figure 10:
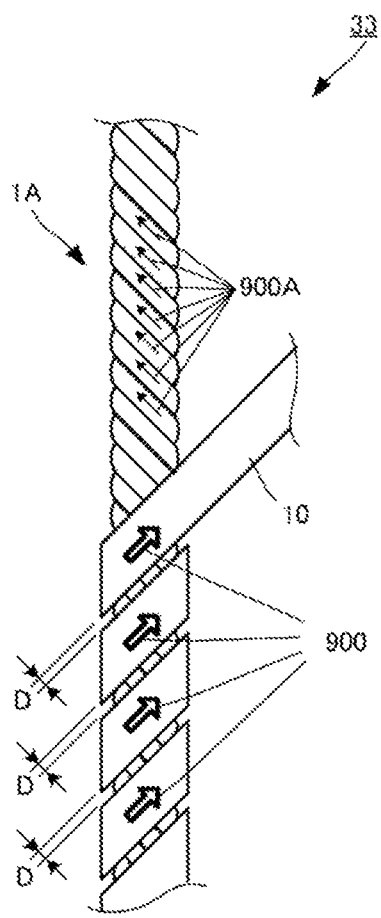
FIG. 10 is a view illustrating a gap between portions of a piezoelectric film 10 exaggeratedly in the piezoelectric thread 33.

FIG. 10 is a view illustrating a gap between portions of the piezoelectric film 10 exaggeratedly in the piezoelectric thread 33. When the piezoelectric film 10 is wound onto the covering thread in the piezoelectric thread 33, the gap, which is a gap D, is generated to some degree. When the piezoelectric thread 33 is pulled in the drawn direction thereof, this gap D causes the generation of an electric field between the surface of the piezoelectric covering thread 1A and the surface of the piezoelectric film 10 to form a circuit. Thus, this structure heightens the antibacterial effect or sterilizing effect of the thread itself. The same matter is applied to piezoelectric thread 34.

In the piezoelectric thread 33, in the case of using PDLA for any one of the piezoelectric covering thread 1A and the piezoelectric film 10, the piezoelectric thread 33 comes to have the same structure as the piezoelectric thread 31 because the front surface of the piezoelectric covering thread 1A is different in the polarity of generated charges from the rear surface of the piezoelectric film 10. Thus, an intense electric field is generated between the front surface of the piezoelectric covering thread 1A and the rear surface of the piezoelectric film 10. This matter is applied, in the piezoelectric thread 34, to the case of using PDLA for any one of the piezoelectric covering thread 2A and the piezoelectric film 10.

Figure 11:
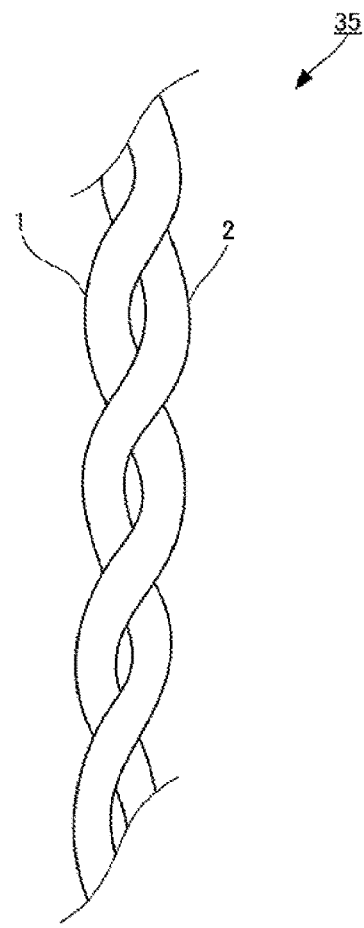
FIG. 11 is a partial exploded view illustrating a structure of a piezoelectric thread 35.

Next, FIG. 11 is a partial exploded view illustrating a structure of a piezoelectric thread 35. The piezoelectric thread 35 is a thread (S thread) obtained by spiraling a line of the piezoelectric thread 1 and a line of the piezoelectric thread 2 leftward to be twisted with each other. The piezoelectric thread 35 is obtained by causing the line of the piezoelectric thread 1 having a surface in which negative charges are generated to cross the line of the piezoelectric thread 2 having a surface in which positive charges are generated. Thus, the thread can singly generate an electric field. As described above, the potentials generated, respectively, in the surface of the piezoelectric thread 1 and in that of the piezoelectric thread 2 forcibly become equal to each other in their approach and contact regions of the surfaces. Correspondingly, the potentials of the thread insides are changed to keep a difference in potential between the surfaces of the threads and the insides thereof. In each of the threads, an electric field created between the thread surface and the thread inside leaks out into the air. The electric fields of the threads are bonded to each other so that a strong electric field is created in the approach and contact regions of the piezoelectric threads 1 and 2. Such twisted threads have a complicated structure. Thus, the approach and contact regions of the piezoelectric threads 1 and 2 are not uniform. When tension is applied to the approach and contact regions, these regions are also changed. As a result of this change, in each of the regions, the electric field is changed in intensity, so that the symmetry of the electric fields is broken. Consequently, an electric field circuit is generated. Also in a thread (Z thread) obtained by spiraling a line of the piezoelectric thread 1 and a line of the piezoelectric thread 2 rightward to be twisted with each other, the line of the piezoelectric thread 1, which has a surface in which negative charges are generated, crosses the line of the piezoelectric thread 2, which has a surface in which positive charges are generated, so that the Z thread can singly generate an electric field. The number of times of the twisting of the piezoelectric thread 1, that of the piezoelectric thread 2, and that of the twisted thread 35 produced by twisting the piezoelectric threads 1 and 2 with each other are each a design item which should be determined in light of the antibacterial effect of these threads. All of the application examples that have been demonstrated hereinbefore can be configured by using the piezoelectric thread 35.

Also, A trilayered covering thread can singly generate an electric field, this thread being a thread in which an ordinary thread is twisted on the side surface of an S thread (or Z thread) and further a Z thread (or S thread) is twisted on the side surface of the ordinary thread.

Figure 12:
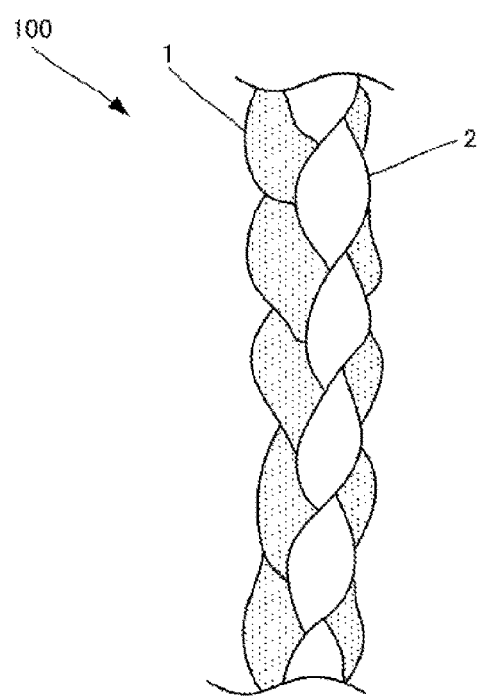
FIG. 12 is a view illustrating a structure of a braid.

FIG. 12 illustrates a thread (third thread) made of a braid obtained by forming, at the same time, a piezoelectric thread 1 spiraled rightward (or leftward) onto the surface of an ordinary thread, and a piezoelectric thread 2 spiraled leftward (or rightward) onto the surface of the ordinary thread. As illustrated in this figure, also in this third thread, respective electric fields are generated at spots where the piezoelectric thread 1 crosses the piezoelectric thread 2, so that the third thread can singly generate an electric field.

It is also conceivable that a thread having a surface in which negative charges are generated is, besides an S thread using PLLA, a Z thread using PDLA. It is also conceivable that a thread having a surface in which positive charges are generated is, besides a Z thread using PLLA, an S thread using PDLA. Accordingly, in the same structure as illustrated in FIG. 11, the following piezoelectric thread can also singly generate an electric field: a piezoelectric thread made of a thread (S thread) obtained by spiraling an S thread using PLLA and an S thread using PDLA leftward to be twisted with each other, or made of a thread (Z thread) obtained by spiraling the same threads rightward to be twisted with each other. The following piezoelectric thread can also singly generate an electric field: a piezoelectric thread made of a thread (S thread) obtained by spiraling a Z thread using PLLA and a Z thread using PDLA leftward to be twisted with each other, or made of a thread (Z thread) obtained by spiraling the same threads rightward to be twisted with each other.

The following will describe an antibacterial effect of threads each made of a piezoelectric substance. The present inventors made quantitative tests (1) and (2) described below to evaluate a bacteria inhibiting effect of a cloth in which threads each made of a piezoelectric substance were woven into each other.

(1) Evaluation of antibacterial effect of cloth in which threads each made of piezoelectric substance were woven into each other a) Test method: bacterium liquid absorption method (JIS L1902), b) Test bacterium: *Staphylococcus aureus* NBRC 12732, c) Inoculated bacterium liquid concentration: $1.4 \times 10^3$ (CFU/mL), d) Standard cloths: a cloth obtained by weaving cotton yarn, and a cloth obtained by knitting cotton yarn, and e) Test sample (sample subjected to antibacterial treatment): a cloth obtained by knitting an S thread (piezoelectric thread 35) in which an S thread (piezoelectric thread 1) and a Z thread (piezoelectric thread 2) were leftward spiraled to be twisted with each other.

[Calculating Expressions]
Proliferation value: G=Mb−Ma
Antibacterial activity value: A=(Mb−Ma)−(Mc−Mo)

The antibacterial activity value of ordinary products subjected to antibacterial treatment is as follows: antibacterial activity value A≥value of 2.0 to 2.2.

Ma: arithmetic average common logarithm of the respective numbers of living bacteria (or the quantity of ATP) in three specimens of each of the standard cloths immediately after the inoculation of the test bacteria, Mb: arithmetic average common logarithm of the respective numbers of living bacteria (or the quantity of ATP) in the three specimens of each of the standard cloths after the bacteria were cultured for 18 to 24 hours, and Mo: arithmetic average common logarithm of the respective numbers of living bacteria (or the quantity of ATP) in three specimens of the test sample (sample subjected to the antibacterial treatment) immediately after the inoculation of the test bacteria, and Mc: arithmetic average common logarithm of the respective numbers of living bacteria (or the quantity of ATP) in the three specimens of the test sample (sample subjected to the antibacterial treatment) after the bacteria were cultured for 18 to 24 hours.

TABLE 1

| Sample | Arithmetic average common logarithm of the number of living bacteria | | Proliferation value G | Antibacterial activation value A |
|---|---|---|---|---|
| (1) Standard Clothes (cotton, and woven product) | Immediately after inoculation | Ma = 4.35 | 2.5 | |
| | After culturing for 18 hours | Mb = 6.83 | | |
| (2) Standard Clothes (cotton, and knitted product) | Immediately after inoculation | Mo = 4.42 | 3.0 | −0.5 on the basis of standard cloth |
| | After culturing for 18 hours (standing still) | Mc = 7.45 | | |
| | After culturing for 18 hours (vibration) | Mc = 6.39 | 2.0 | 0.5 |
| (3) Test sample (cloth obtained by knitting an S-twisted thread of S and Z threads) | Immediately after inoculation | Mo = 4.43 | 1.4 | 1.6 on the basis of (2) |
| | After culturing for 18 hours (standing still) | Mc = 5.80 | | |
| | After culturing for 18 hours (vibration) | Mc = 1.30 | −3.1 | 5.1 |

As is evident from Table 1, the test sample (cloth in which the threads made of the piezoelectric substance are woven into each other) has a higher antibacterial effect against the bacteria than the standard cloths. It is also understood that the test sample is higher in antibacterial effect when the test sample is vibrated than when allowed to stand still. In particular, when the test sample is vibrated to generate an electric field, normal bacteria are hardly observed at a time after 18 hours from the inoculation of the test bacteria (bacilli). Thus, the sample exhibits a high antibacterial effect (sterilizing effect).

(2) Evaluation of anti-mold property of cloth in which threads each made of piezoelectric substance were woven into each other a) Test method: anti-mold quantitative test method (method prescribed by Japan Textile Evaluation Technology Council), b) Test bacteria: *Aspergillus niger* NBRC 105649, c) Inoculated bacterium liquid concentration: $1.1 \times 10^3$ (CFU/mL), d) Standard cloths: a cloth obtained by weaving cotton yarn, and a cloth obtained by knitting cotton yarn, and e) Test sample (sample subjected to antibacterial treatment): a cloth obtained by knitting a piezoelectric thread (piezoelectric thread 35) in which an S thread (piezoelectric thread 1) and a Z thread (piezoelectric thread 2) were leftward spiraled to be twisted with each other.

[Calculating Expressions]

Growth value: F=Fb−Fa

Anti-mold activity value: FS=(Fb−Fa)−(Fc−Fo)

Fa: arithmetic average common logarithm of the respective numbers of living bacteria (or the quantity of ATP) in three specimens of each of the standard cloths immediately after the inoculation of the test bacteria, Fb: arithmetic average common logarithm of the respective numbers of living bacteria (or the quantity of ATP) in the three specimens of each of the standard cloths after the bacteria were cultured for 42 hours, and Fo: arithmetic average common logarithm of the respective numbers of living bacteria (or the quantity of ATP) in three specimens of the test sample (sample subjected to the antibacterial treatment) immediately after the inoculation of the test bacteria, and Fc: arithmetic average common logarithm of the respective numbers of living bacteria (or the quantity of ATP) in the three specimens of the test sample (sample subjected to the antibacterial treatment) after the bacteria were cultured for 42 hours.

TABLE 2

| Sample | Arithmetic average common logarithm of the number of living bacteria | | Growth value F | Anti-mold activity value |
|---|---|---|---|---|
| (1) Standard Clothes (cotton, and woven product) | Immediately after inoculation | Fa = −11.79 | 2.3 | |
| | After culturing for 42 hours | Fb = −9.50 | | |
| (2) Standard Clothes (cotton, and knitted product) | Immediately after inoculation | Fo = −11.69 | 2.3 | 0.0 on the basis of standard cloth |
| | After culturing for 42 hours (standing still) | Fc = −9.39 | | |
| | After culturing for 42 hours (vibration) | Fc = −10.47 | 1.2 | 1.1 |
| (3) Test sample (cloth obtained by knitting an S-twisted thread of S and Z threads) | Immediately after inoculation | Fo = −11.79 | 1.5 | 0.7 on the basis of (2) |
| | After culturing for 42 hours (standing still) | Fc = −10.15 | | |
| | After culturing for 42 hours (vibration) | Fc = −12.67 | −1.0 | 2.2 |

As is evident from Table 2, the test sample (cloth in which the threads made of the piezoelectric substance are woven into each other) also has a higher anti-fungus effect against the fungi (such as mold) than the standard cloths. It is also understood that the test sample is higher in anti-mold effect when the test sample is vibrated than when allowed to stand still. In other words, when the test sample is vibrated to generate an electric field, the sample exhibits a high anti-mold effect.

The above-mentioned results have clearly demonstrated that a cloth into which a thread made of a piezoelectric substance is woven has antibacterial property and anti-molding property.

Other examples of the charge-generating fiber which generates a charge by an energy from the outside include a substance having photoelectric effect, a substance having pyroelectric effect (such as PVDF), and a substance which generates a charge by chemical reaction. The following structure also forms a charge-generating fiber: a structure in which an electroconductive body is used as a core thread, an insulator is wound on the electroconductive body, and further electricity is caused to flow in the electroconductive body. The piezoelectric substance generates an electric field through piezoelectricity, so that no power source is required and no electric shock is favorably caused. Moreover, the lifespan of the piezoelectric substance is sustained longer than the period of an antibacterial effect of any chemical agent or the like. Furthermore, the piezoelectric substance is less likely to cause a risk of generating an allergenic reaction than any chemical agent. In recent years, a serious problem is the generation of bacteria resistant to chemicals, in particular, antibiotics or the like. However, it is not believed that the sterilizing method of the present invention causes the generation of resistant bacteria due to the mechanism of providing the antibacterial effect.

Lastly, it should be interpreted that the description on the present embodiment is a description on examples in all respects and is not restrictive. The scope of the present invention is not described in the embodiment, but recited in the claims. Furthermore, it is intended that the scope of the invention includes all variations within meanings and scopes equivalent to the claims.

DESCRIPTION OF REFERENCE SYMBOLS

1, 2: Piezoelectric thread
1A, 2A: Piezoelectric covering thread
3: Ordinary thread
5: Electroconductive thread
10: Piezoelectric film
11: Core thread
100, 100A: Cloth
900: Drawn direction
910A: First diagonal line
910B: Second diagonal line

The invention claimed is:

1. A charge-generating thread for bacterium-countermeasure, the charge-generating thread comprising a plurality of twisted charge-generating piezoelectric fibers constructed to generate a charge by energy imparted from outside of the fiber, and the charge-generating thread not having a core thread extending linearly along the axis direction of the charge-generating thread.

2. The charge-generating thread for bacterium-countermeasure according to claim 1, wherein the plurality of twisted charge-generating fibers comprise a piezoelectric substance that is twisted around the axis direction of the charge-generating thread.

3. The charge-generating thread for bacterium-countermeasure according to claim 2, wherein the piezoelectric substance comprises polylactic acid.

4. A cloth for bacterium-countermeasure comprising a plurality of the charge-generating threads according to claim 1, the plurality of threads being in a woven configuration.

5. A cloth comprising:

a first thread, the first thread comprising a plurality of twisted charge-generating piezoelectric fibers constructed to generate a first charge by energy imparted from outside of the first thread, and the first thread not having a core thread extending linearly along the axis direction of the first thread; and a second thread that is woven with the first thread.

6. The cloth according to claim 5, wherein the first thread and the second thread are configured to generate an electric field therebetween due to a difference in electric potential between the first and the second thread.

7. The cloth according to claim 5, wherein the first thread and the second thread are configured to generate a current due to a difference in electric potential between the first thread and the second thread.

8. The cloth according to claim 5, wherein the second thread generates a second charge by energy imparted from outside of the second thread.

9. The cloth according to claim 8, wherein the second thread comprises a piezoelectric substance.

10. The cloth according to claim 8, wherein the first charge is different in polarity from the second charge.

11. The cloth according to claim 5, wherein the plurality of twisted charge-generating fibers comprise a piezoelectric substance.

12. The cloth according to claim 11, wherein the piezoelectric substance is a piezoelectric polymer.

13. The cloth according to claim 12, wherein the piezoelectric polymer comprises polylactic acid.

14. The cloth according to claim 5, wherein a plurality of the first thread are arranged in parallel with a plurality of the second thread in the cloth.

15. The cloth according to claim 5, wherein a plurality of the first thread are arranged to cross a plurality of the second thread.

16. The cloth according to claim 5, further comprising a third thread, and wherein the first thread, the second thread, and the third thread are braided together.

17. A clothing article comprising the cloth according to claim 5.

18. A medical member comprising the cloth article according to claim 5.

19. A charge-generating thread that acts on a living body, the charge-generating thread comprising a plurality of twisted charge-generating piezoelectric fibers that generate a charge by energy imparted from outside of the fiber, and the charge-generating thread not having a core thread extending linearly along the axis direction of the charge-generating thread.

20. A charge-generating thread for substance-adsorption, the charge-generating thread comprising a plurality of twisted charge-generating piezoelectric fibers that generate a charge by energy imparted from outside of the fiber, and the charge-generating thread not having a core thread extending linearly along the axis direction of the charge-generating thread.

21. A charge-generating thread for bacterium-countermeasure, the charge-generating thread comprising a plurality of charge-generating piezoelectric fibers each constructed to generate a charge by energy imparted from outside of the fiber, the plurality of charge-generating fibers each having a plurality of sections thereof arranged in a direction that is not parallel to an axis direction of the charge-generating thread, and the charge-generating thread not having a core thread extending linearly along the axis direction of the charge-generating thread.

22. An electric potential generating thread for bacterium-countermeasure, the electric potential generating thread comprising a plurality of twisted electric potential generating piezoelectric fibers constructed to generate an electric potential by a force imparted from outside of the fiber, and the electric potential generating thread not having a core thread extending linearly along the axis direction of the electric potential generating thread.

23. The electric potential generating thread for bacterium-countermeasure according to claim 22, wherein the plurality of twisted electric potential generating fibers comprise a piezoelectric substance that is twisted around the axis direction of the electric potential generating thread.

24. The electric potential generating thread for bacterium-countermeasure according to claim 23, wherein the piezoelectric substance comprises polylactic acid.

25. A cloth for bacterium-countermeasure comprising a plurality of the electric potential generating threads according to claim 22, the plurality of electric potential generating threads being in a woven configuration.

26. A cloth comprising:
a first thread, the first thread comprising a plurality of twisted electric potential generating piezoelectric fibers constructed to generate a first electric potential by a force imparted from outside of the first thread, and the first thread not having a core thread extending linearly along the axis direction of the first thread; and
a second thread that is woven with the first thread.

27. The cloth according to claim 26, wherein the first thread and the second thread are configured to generate an electric field therebetween due to a difference in the generated electric potential between the first thread and the second thread.

28. The cloth according to claim 26, wherein the first thread and the second thread are configured to generate a current due to a difference in the generated electric potential between the first thread and the second thread.

29. The cloth according to claim 26, wherein the second thread generates a second electrical potential by a force imparted from outside of the second thread.

30. The cloth according to claim 29, wherein the second thread comprises a piezoelectric substance.

31. The cloth according to claim 29, wherein the first electrical potential is different from the second electrical potential.

32. The cloth according to claim 26, wherein the plurality of twisted electric potential generating fibers comprise a piezoelectric substance.

33. The cloth according to claim 32, wherein the piezoelectric substance is a piezoelectric polymer.

34. The cloth according to claim 33, wherein the piezoelectric polymer comprises polylactic acid.

35. The cloth according to claim 26, wherein a plurality of the first thread are arranged in parallel with a plurality of the second thread in the cloth.

36. The cloth according to claim 26, wherein a plurality of the first thread are arranged to cross a plurality of the second thread.

37. The cloth according to claim 26, further comprising a third thread, and wherein the first thread, the second thread, and the third thread are braided together.

38. A clothing article comprising the cloth according to claim 26.

39. A medical member comprising the cloth article according to claim 26.

* * * * *